United States Patent [19]
Jacobine et al.

[11] Patent Number: 4,507,187
[45] Date of Patent: Mar. 26, 1985

[54] SILOXANE PHOTOINITIATORS WITH ARYOYL FORMATE GROUPS

[75] Inventors: Anthony F. Jacobine, Meriden, Conn.; Samuel Q. S. Lin, Edgewater, N.J.

[73] Assignee: Loctite Corporation, Newington, Conn.

[21] Appl. No.: 601,871

[22] Filed: Apr. 19, 1984

[51] Int. Cl.$^3$ ............................................. C08F 2/46
[52] U.S. Cl. ........................ 204/159.13; 204/159.14; 204/159.15; 204/159.22; 204/159.16; 204/159.17; 528/25; 528/26; 528/33; 556/437; 556/440
[58] Field of Search ............................ 528/26, 25, 33; 204/159.13, 159.14, 159.22, 159.15, 159.16, 159.17; 556/437, 440

[56] References Cited

U.S. PATENT DOCUMENTS

| | | | |
|---|---|---|---|
| 4,273,907 | 6/1981 | Takamizawa et al. | 528/17 |
| 4,391,963 | 7/1983 | Shirahata | 528/15 |

FOREIGN PATENT DOCUMENTS 0088842  9/1983  European Pat. Off. .

*Primary Examiner*—Melvyn I. Marquis
*Attorney, Agent, or Firm*—Walter J. Steinkraus; Eugene F. Miller

[57] ABSTRACT

Polyorganosiloxane photoinitiators containing aryoyl formate photomoieties bonded to silicon atoms via non-hydrolyzable Si-C bonds. They may be prepared from alkenyl or alkynyl aryoyl formates and polyorganosiloxanes containing silicon hydride groups via hydrosilation. They are effective photoinitiators for photocurable silicone resins and for ethylenically unsaturated monomers, producing cured films with good weatherability and low temperature flexibility.

13 Claims, No Drawings

SILOXANE PHOTOINITIATORS WITH ARYOYL FORMATE GROUPS

BACKGROUND OF THE INVENTION

Many photoinitiators have been developed which are soluble in, and effectively cure, unsaturated organic resins. However, it has been found that such photoinitiators often have limited solubility, and therefore reduced curing effectiveness, in silicones. To overcome this compatibility problem, it has been proposed chemically bond certain photoinitiating moieties to silicones.

A Japanese patent publication, Kokai No. 34,291/76 describes the use of benzophenone derivatives, such as 4-dimethylamino-4'-(trimethoxysilylbenzophenone, in preparing the silicone compatible photoinitiators.

Another Japanese patent publication, Kokai No. 71,199/78, describes the preparation of photoinitiators from the reaction of alkenylsilylbenzophenone and silicones containing silicon hydrides.

Japanese patent publication Kokai No. 50,067/79 and U.S. Pat. No. 4,273,907, describe benzoin type photoinitiators attached to the ends of polydimethylsiloxane through an Si—O—C bond. However, the Si—O—C bond is well known to be hydrolytically unstable.

In U.S. Pat. No. 4,391,963 and in co-pending application Ser. No. 505,588, filed June 20, 1983, there are described silicones having benzoin photomoieties bonded thereto through Si—C bonds. These materials are prepared by hydrosilation of alkenyl substituted benzoins.

In co-pending application Ser. No. 528,287, filed Aug. 31, 1983, there are described Si—H functional siloxy compounds having various alkyl-aryl ketone photoinitiating moieties bound to silicon. These compounds are also prepared by hydrosilation of appropriate olefinically or acetylenically unsaturated photomoieties.

SUMMARY OF THE INVENTION

The present invention pertains to a novel group of polyorganosiloxane photointiators containing aryoyl formate photomoieties bonded to silicon atoms via non-hydrolyzable Si—C bonds. They may be prepared from alkenyl or alkynyl aryoyl formates and polyorganosiloxanes containing silicon hydride groups via hydrosilation. They are effective photoinitiators for photocurable silicone resins and for ethylenically unsaturated monomers, producing cured films with good weatherbility and low temperature flexibility.

DETAILED DESCRIPTION OF THE INVENTION

The inventive silicone photoinitiators and polyorganosiloxanes containing at least one unit represented by the formula:

$$X_a R_b SiO_{(4-a-b)/2}$$

where a is an integer from 1–3, b is an integer from 0–2 and a+b=1–3; R is hydrocarbyl or halogen substituted hydrocarbyl having between one and 10 carbon atoms; and X is an aryoyl formate group of the formula:

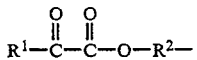

where $R^1$ is aryl or substituted aryl, and $R^2$ is a divalent hydrocarbon of from 3–10 carbon atoms.

Most typically the silicone photoinitiators of the invention will contain other siloxane units of the dimethylsiloxane type. However, siloxane units containing other common groups such as phenyl, H, methoxy, vinyl, methacryloxypropyl, mercaptopropyl, acryloxypropenyl or trifluoropropyl groups may also be incorporated into the polymer. Where such additional groups are free radically curable the inventive photoinitiators will be self curing.

In addition to the self-curing embodiments, compositions of the inventive photoinitiators with photocurable siloxanes such as silicones containing acrylic, vinyl or mercaptopropyl groups may be formulated to give rapidly curing silicone compositions. The inventive photoinitiators may also be advantageously employed with ethylenically unsaturated organic monomers such as isobornyl acrylate and isobornyl methacrylate. Such compositions when cured give unique acrylate/silicone graft copolymers.

The inventive photoinitiators may be prepared from silicon hydride functional silanes or silicones and aryoyl formates of the formula:

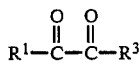

where $R^1$ is as defined above and $R^3$ is an alkenyl or alkynyl group of from 3–10 carbon atoms. Most typically, $R^3$ is allyl or propargyl. The unsaturated aryoyl formate is hydrosilated under conditions identical to those for the hydrosilation of unsaturated benzoin compounds as disclosed in U.S. Pat. No. 4,391,963 and, in co-pending application 505,588, filed June 20, 1983, the disclosures of which are incorporated herein by reference. Where a SiH functional silane is utilized, subsequent polymerization or copolymerization of the silane to the inventive siloxane compounds is also identical to the methods disclosed in the aformentioned references.

SiH functional embodiments of the invention, particularly disiloxane embodiments with SiH functionality may be used as grafting agents to add aryoyl formate photoinitiating groups to vinyl silicones or unsaturated organic polymers such as polybutadienes, using the techniques of copending application Ser. No. 528,287, filed Aug. 31, 1983, now U.S. Pat. No. 4,477,326, the disclosure of which is also incorporated herein by reference.

The invention may be illustrated by the following nonlimiting examples.

EXAMPLE 1

Allyl benzoyl formate was prepared by mixing benzoyl formic acid (25 grams, 0.16M), allyl alcohol (11.6 grams, 0.20M) and toluenesulfonic acid (1 gram) in a 500 ml round-bottomed flask equipped with a Dean Stark trap. Toluene (300 ml) was added and the mixture was stirred and heated to reflux. When the theoretical amount of water was collected, the reaction was analyzed and found to be complete by gas chromatography. The reaction mixture was cooled and drowned in a saturated sodium bicarbonate solution. The organic layer was separated, washed with water, dried over sodium sulfate and concentrated on a rotary evaporator. The crude product was distilled in vacuo and the fraction boiling from 99° C.-103° C. at 0.8 mm Hg was collected.

0.2 grams of allyl benzoyl formate and 5 grams of a silicon hydride functional dimethyl silicone having a calculated molecular weight of about 15,000 and a calculated $4.46 \times 10^{-4}$ equivalence H/gram were weighed into a 3-necked, round-bottomed 25 ml flask with magnetic stirrer and thermometer. The temperature of the mixture was brought to 100° C. and a drop (approximately 0.1 grams) of a 2% chloroplatinic acid solution in butyl acetate was added. The cloudy mixture exothermed to 110° C. and became clear. The reaction was terminated by allowing the mixture to cool. The product was misible in a 28,000 molecular weight dimethyl silicone terminated with methacryloxypropyldimethylsilyl groups, and in 70,000 molecular weight dimethyl silicones containing 2%, 5%, and 8% methylvinyl siloxane units. 20% solutions of the product in the respective acrylic or vinyl silicones were cast as thin films onto glass slide and irradiated in a 70,000 microwatt/cm UV oven for 2 minutes, producing a cured film coating.

EXAMPLE 2

Propargyl benzoyl formate was prepared by the method of the first paragraph of Example 1 except that an equivalent amount of propargyl alcohol was substituted for allyl alcohol. One gram of the propargyl benzoyl formate and 10 grams of the SiH functional silicone utilized in Example 1 were weighed into a 50 ml 3-necked, round-bottomed flask equipped with nitrogen blanket, thermometer and magnetic stirrer. The reaction was heated to 90° and 0.2 grams of a 2% chloroplatinic acid solution in butyl acetate was added. An exotherm to 115° C. was observed. After 30 minutes an IR scan showed no SiH absorption at 2140 cm$^{-1}$. The reaction was terminated by allowing to cool. A film was formed from a 10% mixture of the above product and a 70,000 molecular weight dimethyl silicone having 8% methylvinylsiloxane units. The film was irradiated for 2 minutes as in Example 1 and formed a clear cured film.

We claim:

1. An organopolysiloxane photoinitiator comprising an average of at least 2 siloxane units, of which at least an average of one siloxane unit per organosiloxane molecule has the formula:

$$X_aR_bSiO_{(4-a-b)/2}$$

wherein X denotes an aryoyl formate group of the formula:

$$R^1-\overset{O}{\underset{\|}{C}}-\overset{O}{\underset{\|}{C}}-O-R^2-$$

R is hydrocarbyl or halogen substituted hydrocarbyl of from 1-10 carbon atoms; a is an integer from 1-3, b is an integer from 0-2, $a+b=1-3$; $R^1$ is aryl or substituted aryl; and $R^2$ is a divalent hydrocarbon group of from 3-10 carbon atoms.

2. A photoinitiator as in claim 1 further comprising siloxane units containing methyl, methoxy, hydride, mercaptopropyl, trifluoropropyl, phenyl, methacryloxypropyl, vinyl or acryloxypropenyl groups.

3. A photoinitiator as in claim 2 comprising a plurality of dimethylsiloxane units.

4. A photoinitiator as in claim 2 having less than 1,000 siloxane units.

5. A photoinitiator as in claim 2 wherein the aryoyl formate containing siloxane units comprised between 0.1% and 10% of the total repeat units of the organopolysiloxane molecule.

6. A photoinitiator as in claim 5 having between 0.2% and 5% of said aryoyl formate containing units.

7. A composition comprising a photoinitiator of claim 1 and an organopolysiloxane with photocurable functionality.

8. A composition comprising a photoinitiator as in claim 1 and an ethylenically unsaturated organic monomer or prepolymer.

9. A composition as in claim 8 wherein said ethylenically unsaturated monomer or prepolymer is an acrylate or methacrylate ester compound.

10. A method of preparing a photoinitiator as in claim 1 comprising reacting by a hydrosilation reaction, an unsaturated aryoyl formate compound of the formula:

$$R^1-\overset{O}{\underset{\|}{C}}-\overset{O}{\underset{\|}{C}}-R^3$$

wherein $R^1$ is aryl or substituted aryl and $R^3$ is an alkenyl or alkynyl group having between 3 and 10 carbon atoms, with an organopolysiloxane having an average of at least 2 siloxane units and at least an average of one silicon bonded hydrogen atom per molecule.

11. A method as in claim 10 wherein $R^3$ is propenyl.

12. A method as in claim 10 wherein $R^3$ is propynyl.

13. A method of forming a crosslinked polymer comprising subjecting the composition of claim 7 to actinic irradiation for sufficient time and intensity to cure said composition.

* * * * *

UNITED STATES PATENT OFFICE
CERTIFICATE OF CORRECTION

Patent No. 4,507,187                  Dated March 26, 1985

Inventor(s) Anthony F. Jacobine & Samuel Q.S. Lin

It is certified that error appears in the above-identified patent and that said Letters Patent are hereby corrected as shown below:

The formula
$$R'-\overset{O}{\overset{\|}{C}}-\overset{O}{\overset{\|}{C}}-R^3$$

which appears at column 2, line 30, and in Claim 10 (column 4, line 40) should be $$R'-\overset{O}{\overset{\|}{C}}-\overset{O}{\overset{\|}{C}}-O-R^3 \ .$$

Signed and Sealed this

Twenty-eighth Day of January 1986

[SEAL]

Attest:

DONALD J. QUIGG

Attesting Officer    Commissioner of Patents and Trademarks